United States Patent
Fischer (10) Patent No.: US 9,299,541 B2
(45) Date of Patent: Mar. 29, 2016

(54) METHODS AND APPARATUSES FOR EFFECTIVELY REDUCING GAS RESIDENCE TIME IN A PLASMA PROCESSING CHAMBER

(75) Inventor: Andreas Fischer, Castro Valley, CA (US)

(73) Assignee: Lam Research Corporation, Fremont, CA (US)

(*) Notice: Subject to any disclaimer, the term of this patent is extended or adjusted under 35 U.S.C. 154(b) by 18 days.

(21) Appl. No.: 13/436,728

(22) Filed: Mar. 30, 2012

(65) Prior Publication Data

US 2013/0256266 A1    Oct. 3, 2013

(51) Int. Cl.
  *H01J 37/32* (2006.01)
(52) U.S. Cl.
  CPC .................. *H01J 37/32972* (2013.01)
(58) Field of Classification Search
  CPC .............. H01J 37/32917; H01J 37/32935; H01J 37/32954; H01J 37/32972; H01J 37/3299; H01J 37/3244
  See application file for complete search history.

(56) References Cited

U.S. PATENT DOCUMENTS

| | | | | |
|---|---|---|---|---|
| 2003/0141822 A1* | 7/2003 | Sirkis et al. | ............. | 315/111.21 |
| 2004/0173571 A1* | 9/2004 | Laermer | ......................... | 216/67 |
| 2005/0009347 A1* | 1/2005 | Matsumoto et al. | ......... | 438/689 |
| 2005/0082482 A1* | 4/2005 | Ludviksson | ................. | 250/342 |
| 2005/0087296 A1* | 4/2005 | Goto et al. | ............... | 156/345.24 |
| 2008/0078506 A1* | 4/2008 | Verbeck et al. | .......... | 156/345.48 |
| 2008/0233723 A1* | 9/2008 | Okumura et al. | ............. | 438/513 |
| 2009/0251700 A1* | 10/2009 | Venugopal et al. | ........... | 356/437 |

FOREIGN PATENT DOCUMENTS

| | | | | |
|---|---|---|---|---|
| JP | 58125822 A | * | 7/1983 | |
| JP | 03260068 A | * | 11/1991 | |
| JP | 04006834 A | * | 1/1992 | |
| JP | 09192479 A | * | 7/1997 | |
| JP | 11224795 A | * | 8/1999 | |
| JP | 2000021854 A | * | 1/2000 | |
| JP | 2000021855 A | * | 1/2000 | |
| JP | 2000114198 A | * | 4/2000 | |
| JP | 2002124398 A | * | 4/2002 | |
| JP | 2003129244 A | * | 5/2003 | |
| JP | 2004039952 A | * | 2/2004 | |
| JP | 2004186565 A | * | 7/2004 | |
| JP | 2005257428 A | * | 9/2005 | |
| JP | 2006093519 A | * | 4/2006 | |
| JP | 2006274420 A | * | 10/2006 | |
| JP | 2007110026 A | * | 4/2007 | |

* cited by examiner

*Primary Examiner* — Jeffrie R Lund
*Assistant Examiner* — Yuechuan Yu
(74) *Attorney, Agent, or Firm* — Beyer Law Group LLP (57) ABSTRACT

Methods and apparatuses for controlling plasma generation in a plasma processing chamber to reduce an effective residence time of by-product gases or to control in real time the concentration of certain polymer pre-cursors or reaction by-products in the plasma processing chamber are disclosed. The gas residence time is "effectively" reduced by reducing the plasma reaction for at least a portion of the process time. Thresholds can be provided to control when the plasma reaction is permitted to proceed at the full rate and when the plasma reaction is permitted to proceed at the reduced rate. By reducing the rate of plasma by-product generation at least for a portion of the process time, the by-product gas residence time may be effectively reduced to improve process results.

19 Claims, 7 Drawing Sheets

METHODS AND APPARATUSES FOR EFFECTIVELY REDUCING GAS RESIDENCE TIME IN A PLASMA PROCESSING CHAMBER

BACKGROUND OF THE INVENTION

Plasma has long been employed for processing substrates (e.g., wafers, flat panel displays, liquid crystal displays, etc.) into electronic devices (e.g., integrated circuit dies) for incorporation into a variety of electronic products (e.g., smart phones, Computers, etc.).

In plasma processing, a plasma processing system having one or more plasma processing chambers may be employed to process one or more substrates. In each chamber, plasma generation may employ capacitively coupled plasma technology, inductively coupled plasma technology, electron-cyclotron technology, microwave technology, etc.

During the processing of a wafer, for example, reactant gas (which may employ one or multiple types of gases) is released into the plasma processing region and energized to form a plasma. For example, if the plasma is employed to etch the planar portion of the substrate (as opposed to the bevel portion), the plasma is confined to the plasma processing region that is centered above the substrate and is generally bounded by the substrate, the upper electrode or upper chamber wall/component and/or the confinement ring set. The plasma is then employed to etch, deposit, or otherwise process exposed areas of the wafer surface During processing, the plasma interacts with exposed areas on the substrate, which interaction both processes the exposed areas and generates by-products. The by-product gas is then pumped away as plasma continues to be generated from the supplied reactant gas. Other components in the plasma (either ions or radicals) may form certain pre-cursors that are critical for the side wall protection of etched structures to assure an anisotropic etch. By way of example, such pre-cursors may result in polymer deposition on feature sidewalls to improve etch directionality. Other pre-cursors may advantageously result in certain etch selectivities between films of different material which would be hard to accomplish otherwise.

Figure 1:
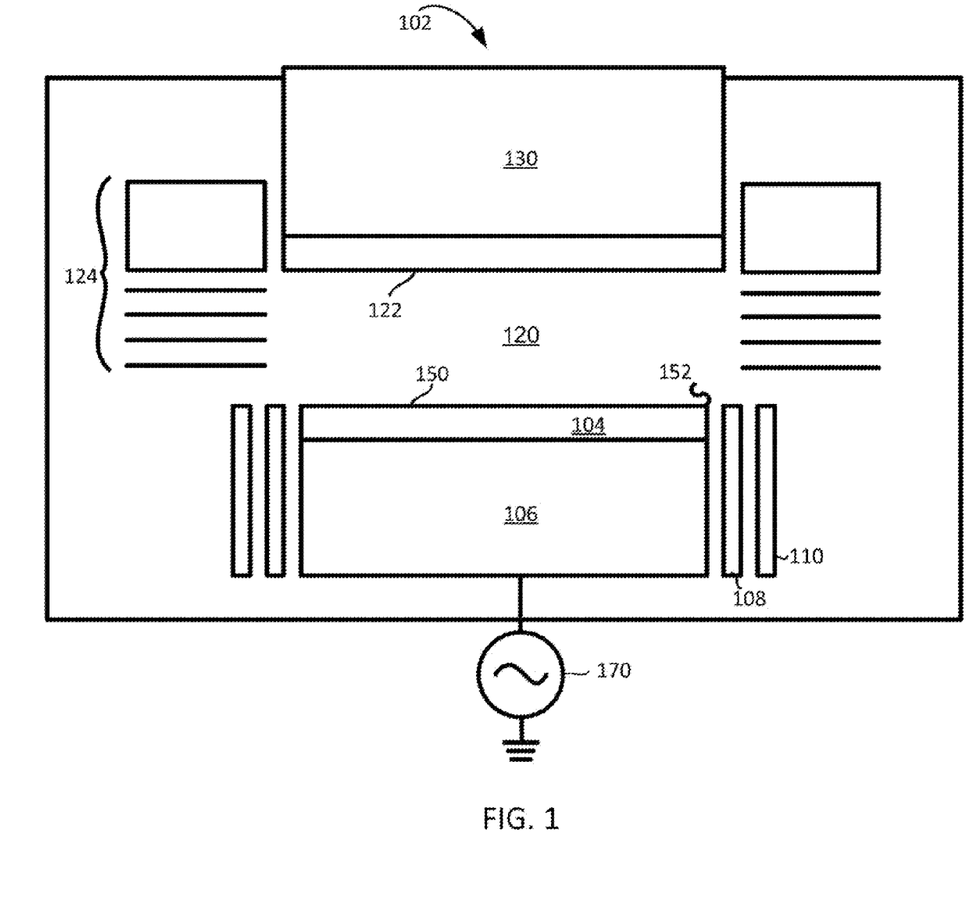
FIG. 1 shows a conventional plasma processing chamber in a plasma processing system (which may have one or multiple chambers) to facilitate discussion.

FIG. 1 shows a conventional plasma processing chamber 102 in a plasma processing system (which may have one or multiple chambers). In FIG. 1, substrate 104 is shown disposed on an electrostatic chuck (ESC) 106 forming a lower electrode. Insulator ring 108 and ground ring 110 are shown surrounding ESC 106. Plasma processing region 120 is shown bounded by a chamber ceiling 122, lower electrode/ESC 106, and a set of confinement rings 124. In the case of a capacitively coupled plasma processing system, chamber ceiling 122 may represent the upper electrode, for example. In other systems, the chamber ceiling may simply represent a chamber structure for confining the plasma.

Reactant gases are supplied from external gas supplies (conventional and not shown) via gas plenum 130, which may also include heating apparatus to control the temperature of upper electrode 122. In the example of FIG. 1, plasma processing chamber 102 is a capacitively coupled plasma chamber and thus chamber ceiling 122 may represent an upper electrode, which may be grounded or may be provided with RF energy for example.

A plasma generation power source 170, in the form of an RF power supply in the example of FIG. 1, supplies RF energy to lower electrode/ESC 106 to ignite a plasma in plasma processing region 120. In other chamber designs or in chambers using different plasma generation technology, the plasma generation power source 170 may include multiple power sources to provide RF energy to different components of the chamber or may be another type of plasma generation technology other than RF (such as microwave, for example).

By-product gas may be exhausted either through chamber side or chamber bottom or both. The components of plasma processing chamber 102 as well as other existing plasma generation chambers using capacitively coupled plasma or other plasmas generated using different plasma generation technologies are conventional and well known to those skilled in the art and will not be elaborated here.

It has been observed that in some plasma processing chambers, a certain degree of process non-uniformity (in terms of processing rate or processing result) exists from the center region 150 of substrate 104 to edge region 152 of substrate 104. When etching in narrow-gap chambers (narrow gap chambers represent chambers wherein the gap between the substrate upper surface and the lower surface of the upper electrode may be less than 10% of the substrate diameter) and/or processing larger substrates (such as 450 mm wafers or larger), non-uniformity issues tend to exacerbate.

In some cases, etching of high aspect ratio features tends to suffer from a phenomenon known as ARDE (Aspect Ratio Dependent Etching). Some evidence suggests that one mechanism responsible for ARDE is the relatively long time it takes for reaction by-products from the lower parts of deep structures such as high aspect-ratio holes (or trenches) to diffuse out to the surface of the wafer from where they can be pumped away. The increased abundance of etch by-products at the bottom of deep features slows down the re-supply of new etchants thereby reducing their concentration. This leads to a slowing of the etch front compared to the rate just beneath the mask as the front advances deeper into the feature In view of the foregoing, improved etching techniques and apparatuses are desired.

BRIEF DESCRIPTION OF THE DRAWINGS

The present invention is illustrated by way of example, and not by way of limitation, in the figures of the accompanying, drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatuses for controlling plasma generation in a plasma processing chamber to reduce an effective residence time of by-product gases in the plasma processing chamber. The effective residence time may be defined as the average time a gas/plasma constituent resides above the substrate with the plasma in the 'etch' state (such as in accordance with the normal etch recipe). Embodiments of the invention seek to reduce the effective residence time by RF power modulation to reduce the etch-state plasma duration, e.g., to a shorter amount of time than it would take a plasma/gas constituent to physically travel from above the wafer to a region outside the wafer. for example, if the normal (prior art recipe) gas residence time is 20 milliseconds for a given chamber and the RF-on time is, in accordance with one embodiment of the invention, only 5 milliseconds of that 20 milliseconds, the effective residence time may be considered to be roughly 5 milliseconds, which is about 25% of 20 milliseconds.

With regard to the non-uniformity issues, it has been theorized by the inventor herein that by-product gas concentration may increase toward the edge of the substrate relative to the by-product gas concentration that exists at the center of the substrate. This is because in most chambers, the by-product gas travels from the center of the substrate toward the edge of the substrate prior to being exhausted through the chamber side or chamber bottom or both. The differences in by-product gas concentration over different regions of the substrate may be one contributing factor in process non-uniformity.

Reducing the gas residence time (i.e., the time that the gas resides in the chamber prior to being exhausted) may improve process uniformity (which may refer to etch uniformity, deposition uniformity, etch rate uniformity, deposition rate uniformity, etch depth uniformity, and/or deposition thickness uniformity depending on the type of processing involved). As is generally known, gas residence time is dependent on the plasma volume above the substrate, the pumping speed of the exhaust pump arrangement, and the process gas pressure. There is a lower limit on how much gas residence time can be reduced since, for example, the plasma volume cannot be reduced indefinitely for a certain pumping speed and pressure.

In accordance with one or more embodiments of the invention, the gas residence time is "effectively" reduced by reducing the plasma reaction for at least a portion of the process time. As the tennis employed herein, the process time refers to the time required for processing the substrate in accordance with a given recipe. In accordance with one or more embodiments of the invention, the plasma processing chamber is operated in the normal processing mode in accordance with the provided processing recipe for a portion of the process time duration. For another portion of the process time duration, the plasma processing chamber is operated in the "reduced" mode whereby the plasma generation energy (be it RF or microwave or some other form of plasma generation energy) is reduced in order to reduce or stop the reaction with exposed portions of the substrate.

Alternatively, in accordance with one or more embodiments of the invention, the gas residence time is "effectively" reduced by reducing the plasma reaction for at least a portion of the "actual" gas residence time. As the term is employed herein, the "actual" gas residence time refers to the time the gas actually spends in the chamber and is related to the ratio of the capacity of the chamber to hold the gas (which is in turn related to the gas pressure and volume) divided by the rate of removal of the gas from the chamber. In accordance with one or more embodiments of the invention, the plasma processing chamber is operated in the normal processing state in accordance with the provided processing recipe for a portion of the actual gas residence time duration. For another portion of the actual gas residence time portion, the plasma processing chamber is operated in the "reduced" mode whereby the plasma generation energy (be it RF or microwave or some other form of plasma generation energy) is reduced in order to reduce or stop the reaction with exposed portions of the substrate.

During the "reduced mode" time, reaction by-product gas travels toward the edge of the substrate without significantly engaging in secondary reactions with the exposed portion of the substrate. Once the reduced mode time expires, the plasma generation energy is increased again to process the substrate at the full level. In one or more embodiments, reactant gas flow into the chamber remains unchanged during the "reduced mode" time. In one or more embodiments, the range of interval lengths can be between 1 msec to the full length of the etch step.

In one or more embodiments, the plasma is actively monitored to control the start and the termination of the reduced mode. In one or more embodiments, a light emitting apparatus is employed to emit light into the plasma processing region and to monitor the altered light after traversal through the plasma processing region. The light may be altered by having some portion of its wavelength absorbed, for example. The light may be altered by fluorescing, for example. Irrespective, the altered light is monitored and compared against two thresholds as a function of wavelength.

If a parameter (such as the intensity of the absorbed wavelength or the intensity of the fluoresced wavelength, for example) equals or exceeds a first threshold, the plasma is controlled to enter the reduced mode. Once in the reduced mode, reaction reduces or stops and by-product gas concentration reduces over time. If the parameter equals or is below a second threshold, the plasma is controlled to exit the reduced mode. After the reduced mode is exited, reaction may increase back up to the full level, for example. In the context of embodiments of the invention, reduced mode refers to a lower RF power level compared to the normal etch mode and may include the plasma off state. For example, in accordance with an embodiment of the invention, the plasma is greatly reduced but not completely extinguished during the reduced mode in order to avoid complications and delays associated with plasma re-ignition and stabilization. As another example, in accordance with another embodiment of the invention, the plasma may be off during the reduced made.

The features and advantages of embodiments of the invention may be better understood with reference to the figures and discussions that follow.

Figure 2:
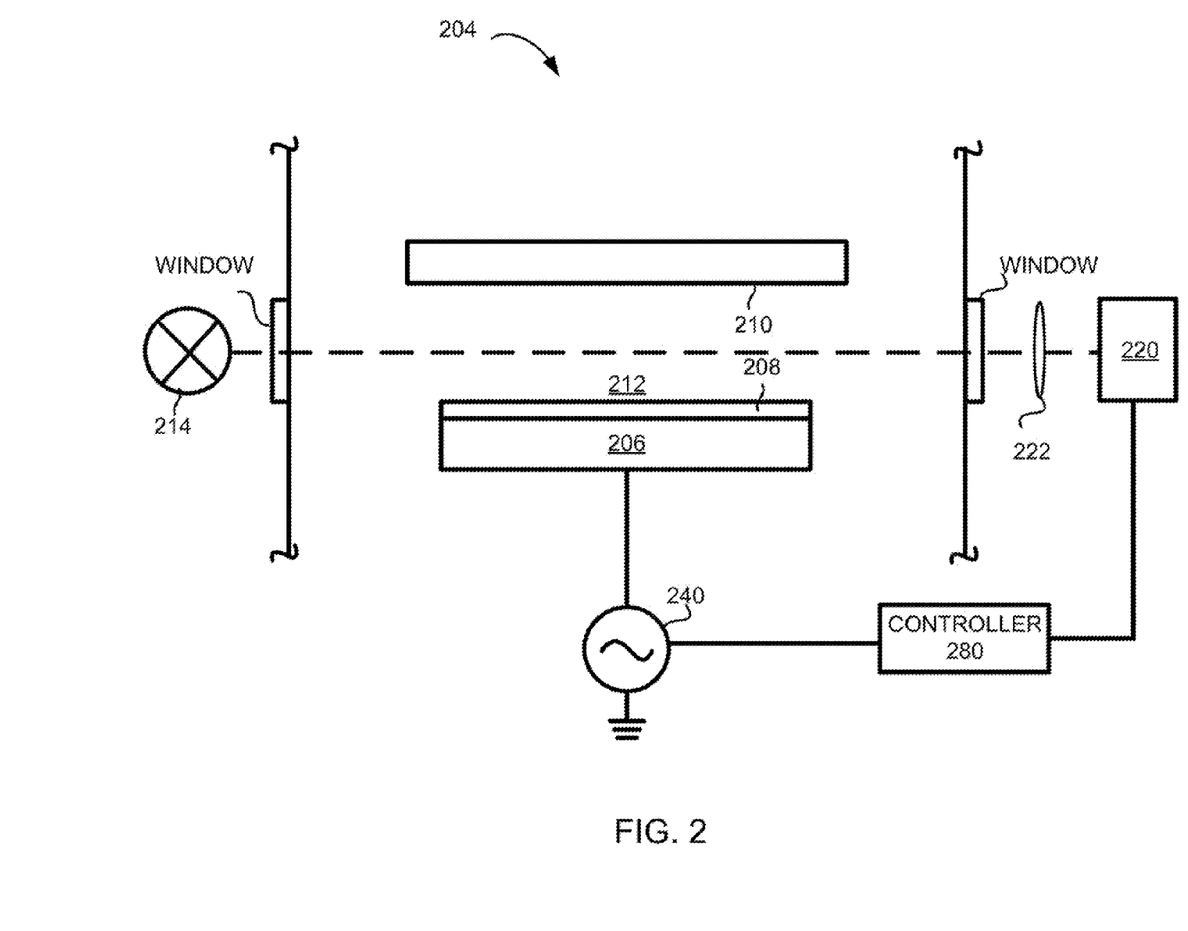
FIG. 2 shows, in accordance with an embodiment of the invention, a simplified drawing of a portion of the inventive chamber for reducing the effective gas residence time in order to improve uniformity.

FIG. 2 shows, in accordance with an embodiment of the invention, a simplified drawing of a portion of the inventive chamber for reducing the effective gas residence time in order to improve uniformity. With reference to FIG. 2, a plasma processing system having at least one plasma processing chamber 204 includes a lower electrode 206 for supporting a substrate 208 during processing. Chamber ceiling 210, which represents the upper electrode in the case of a capacitively coupled plasma processing chamber or the dielectric window in the case of an inductively coupled plasma processing chamber for example, forms the upper bound of a plasma processing region 212. A light emitting apparatus 214 in the form of, for example, a light source with a collimator emits light through the plasma processing region 212. The light emitted may be monochromatic (e.g., laser) or may be broadband. As the light traverses plasma processing region 212, the light traverses the plasma and/or gas and/or matter existing in plasma processing region 212 and is altered. The altered light is received by a light receiving apparatus 220, representing in the example of FIG. 2 an optical emission spectroscopy (OES) meter. A lens 222 may be provided to focus the altered light on the OES sensor.

Light receiving apparatus 220 may include an analysis sub-unit which compares a parameter (such as the intensity of the absorbed wavelength or the intensity of the fluoresced wavelength, for example) of the altered light to two thresholds and provide signals responsive to the analysis result. If a parameter (such as the intensity of the absorbed wavelength or the intensity of the fluoresced wavelength, for example) equals or exceeds a first threshold, a signal is sent by controller 280 (which is in communication with light receiving apparatus 220 and may be integrated with light receiving apparatus 220 or may be a separate component) to RF power supply 240 (representing the plasma generation power source in the example of FIG. 2) to control the plasma (such as to reduce the RF power) to enter the reduced mode. Once in the reduced mode, reaction reduces or stops and by-product gas concentration reduces over time. If the parameter equals or is below a second threshold, another signal is sent by controller 280 to the RF power supply 240 to control the plasma (such as to increase the RF power) to exit the reduced mode. After the reduced mode is exited, reaction may increase back up to the full level, for example.

Figure 3:
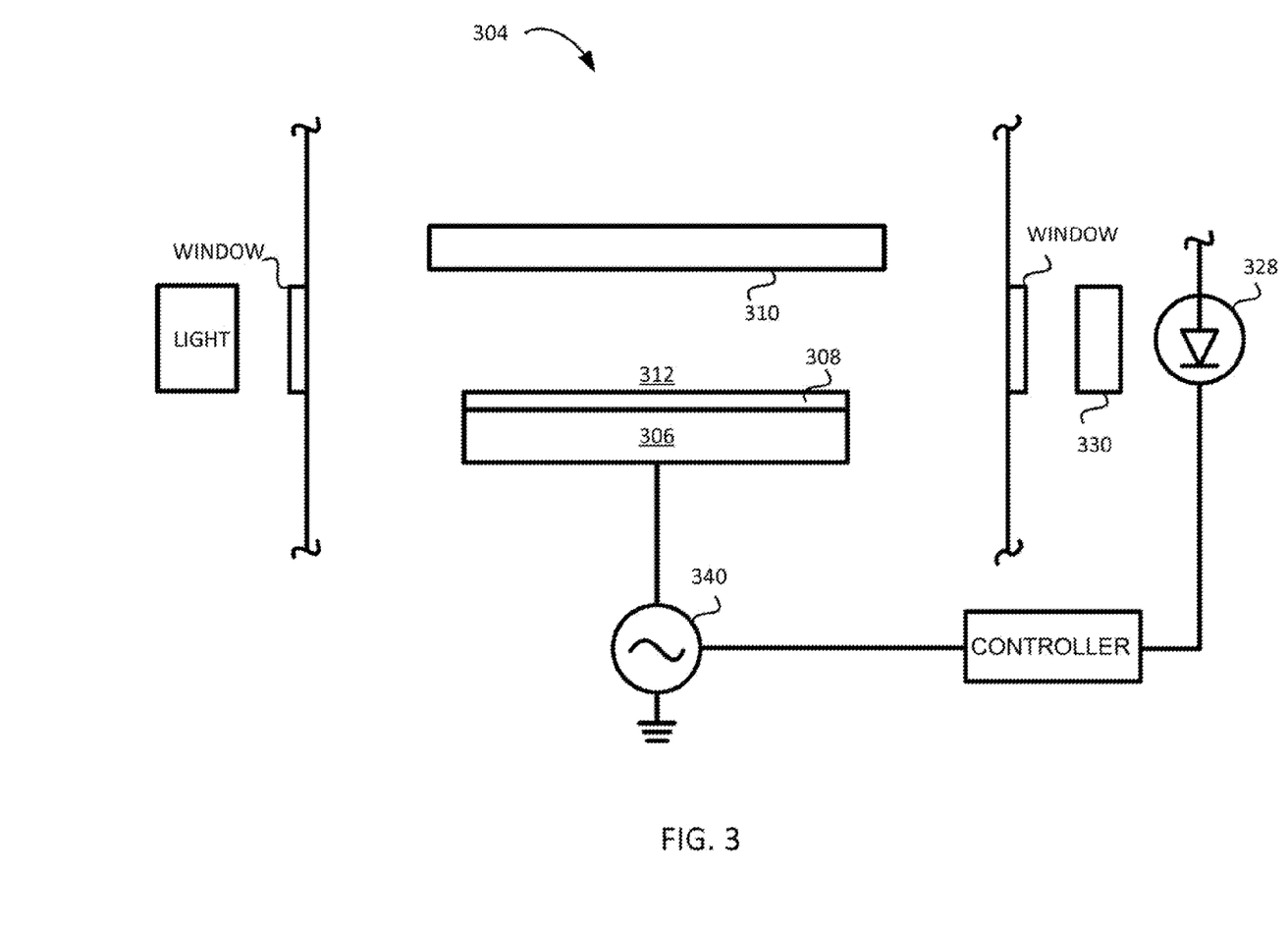
FIG. 3 shows, in accordance with an embodiment of the invention, a simplified drawing of a portion of the inventive chamber for reducing the effective gas residence time in order to improve uniformity.

FIG. 3 shows, in accordance with an embodiment of the invention, a simplified drawing of a portion of the inventive chamber for reducing the effective gas residence time in order to improve uniformity. With reference to FIG. 3, a plasma processing system having at least one plasma processing chamber 304 includes a lower electrode 306 for supporting a substrate 308 during processing. Chamber ceiling 310, which represents the upper electrode in the case of a capacitively coupled plasma processing chamber or the dielectric window in the case of an inductively coupled plasma processing chamber for example, forms the upper bound of a plasma processing region 312. A light emitting apparatus 314 in the form of, for example, a light source with a collimator emits light through the plasma processing region 312. The light emitted may be monochromatic (e.g., laser) or may be broadband.

As the light traverses plasma processing region 312, the light traverses the plasma and/or gas and/or matter existing in plasma processing region 312 and is altered. The altered light is received by a light receiving apparatus, representing in the example of FIG. 3 a photodiode 328 and an interference filter 330.

Light receiving apparatus 320 may include an analysis sub-unit which compares a parameter (such as the intensity of the absorbed wavelength or the intensity of the fluoresced wavelength, for example) of the altered light to two thresholds and provides signals responsive to the analysis result. If a parameter (such as the intensity of the absorbed wavelength or the intensity of the fluoresced wavelength, for example) equals or exceeds a first threshold, a signal is sent (using for example a controller as described in FIG. 2) to RF power supply 340 (representing the plasma generation power source in the example of FIG. 3) to control the plasma (such as to reduce the RF power) to enter the reduced mode. Once in the reduced mode, reaction reduces or stops and by-product gas concentration reduces over time. If the parameter equals or is below a second threshold, another signal is sent to the RF power supply 340 to control the plasma (such as to increase the RF power) to exit the reduced mode. After the reduced mode is exited, reaction may increase back up to the full level, for example.

Figure 4:
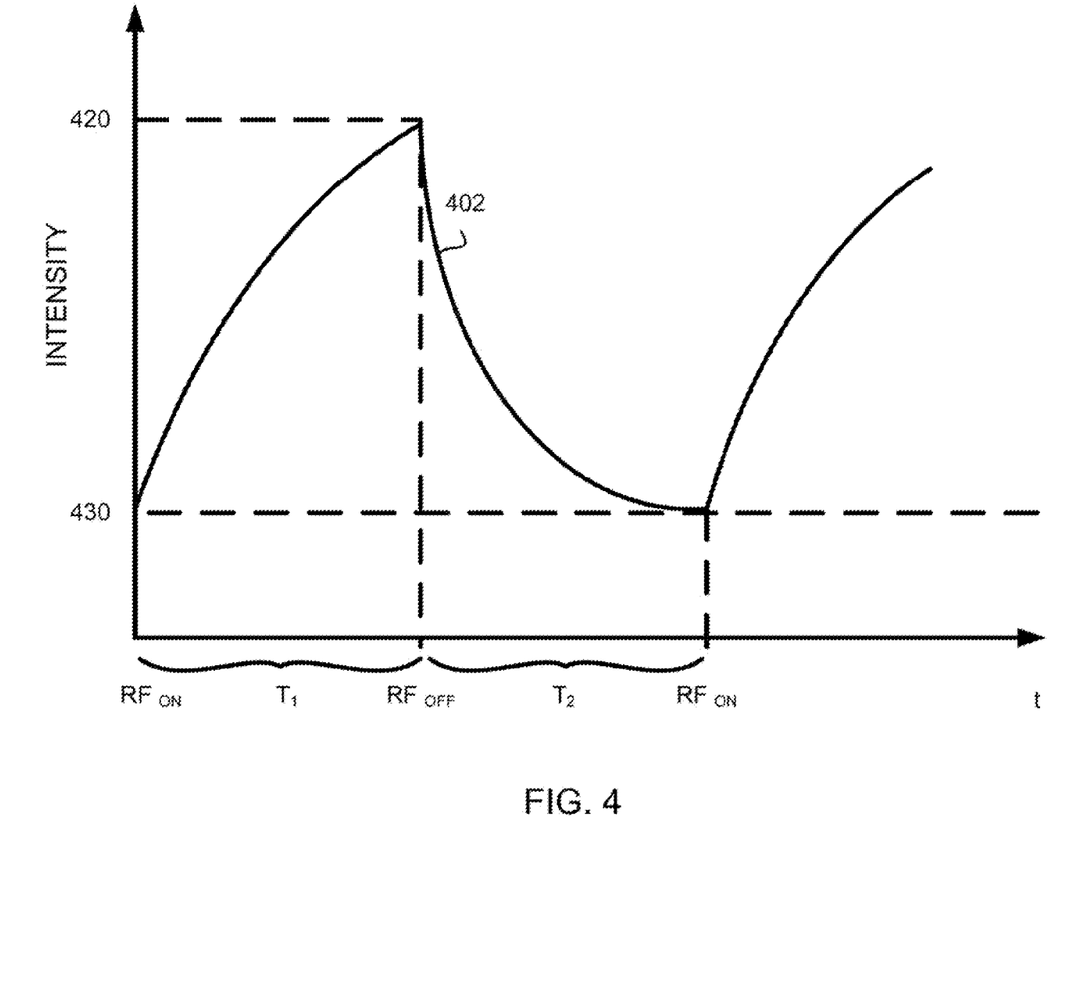
FIG. 4 shows, in accordance with an embodiment of the invention, a graph of signal strength of fluorescence or absorption as a function of time.

FIG. 4 shows, in accordance with an embodiment of the invention, a graph of signal strength of fluorescence or absorption as a function of time. During the time T1, the plasma processing chamber operates in the normal mode and processing occurs at the full level. The signal strength 402 is monitored and if signal strength 402 equals or exceeds threshold 420, the plasma is controlled by changing the RF power to enter the reduced mode. The reduced mode duration is shown as time T2. The signal strength 402 is continued to be monitored and if signal strength 402 equals or falls below threshold 430, the plasma is controlled by changing the RF power to exit the reduced mode. In the example of FIG. 4, after the chamber exits the reduced mode, plasma processing resumes at the full level. During the time T1 and T2, the flow rate of the reactant gas into the chamber is kept constant, in one or more embodiments.

Figure 5:
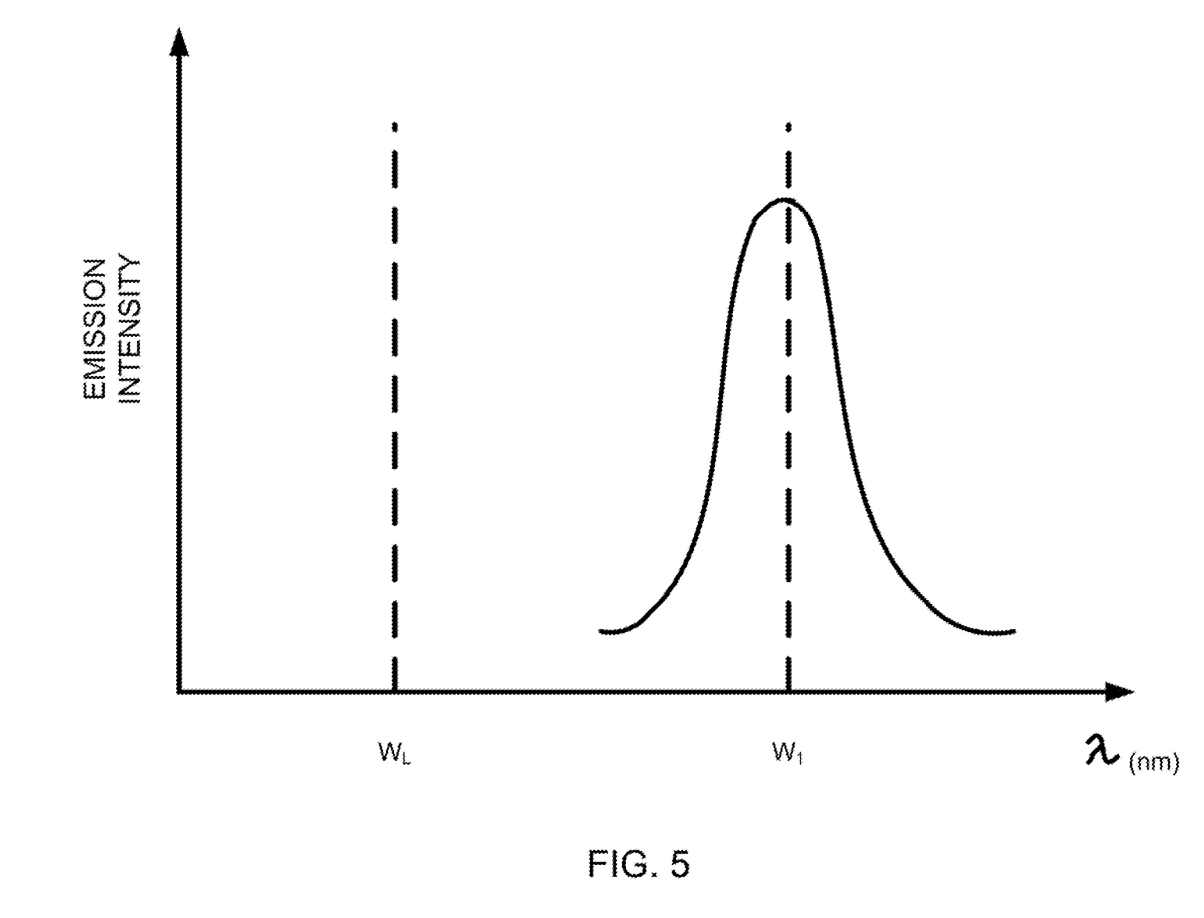
FIG. 5 shows, in accordance with an embodiment of the invention, a graph of signal intensity versus wavelength of the fluorescent light emitted after a laser light beam is emitted from the light emitting apparatus and received by the light receiving apparatus.

FIG. 5 shows, in accordance with an embodiment of the invention, a graph of signal intensity versus wavelength of the fluorescent light emitted after a laser light beam is emitted from the light emitting apparatus and received by the light receiving apparatus. As can be seen in FIG. 5, the laser with wavelength WL causes some gas of the by-product gas in the plasma processing region to fluoresce with a wavelength W1. By monitoring the intensity of the fluoresce light, the concentration of the by-product gas can be approximated or calculated and compared with the two thresholds in the manner discussed earlier.

Figure 6:
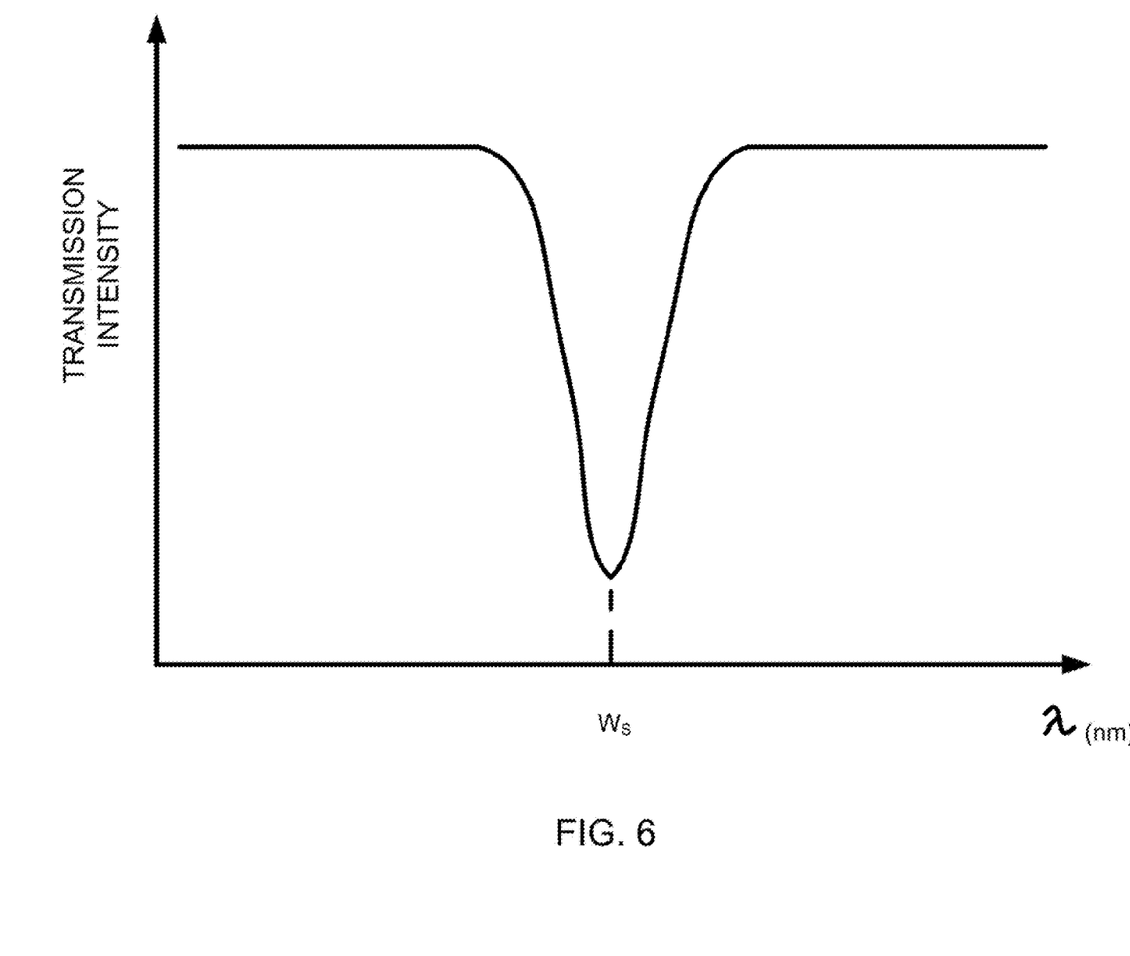
FIG. 6 shows, in accordance with an embodiment of the invention, a graph of signal intensity versus wavelength of the transmitted light after it has passed through an absorbing medium after a broad (white) spectrum light beam is emitted from the light emitting apparatus and received by the light receiving apparatus.

FIG. 6 shows, in accordance with an embodiment of the invention, a graph of signal intensity versus wavelength of the absorbed light emitted after a broad (white) spectrum light beam is emitted from the light emitting apparatus and received by the light receiving apparatus. As can be seen in FIG. 6, the by-product gas absorbs some portion of wavelength WS of the spectrum of the white light. By monitoring how much light is absorbed at wavelength WS, the concentration of the by-product gas can be approximated or calculated and compared with the two thresholds in the manner discussed earlier.

Figure 7:
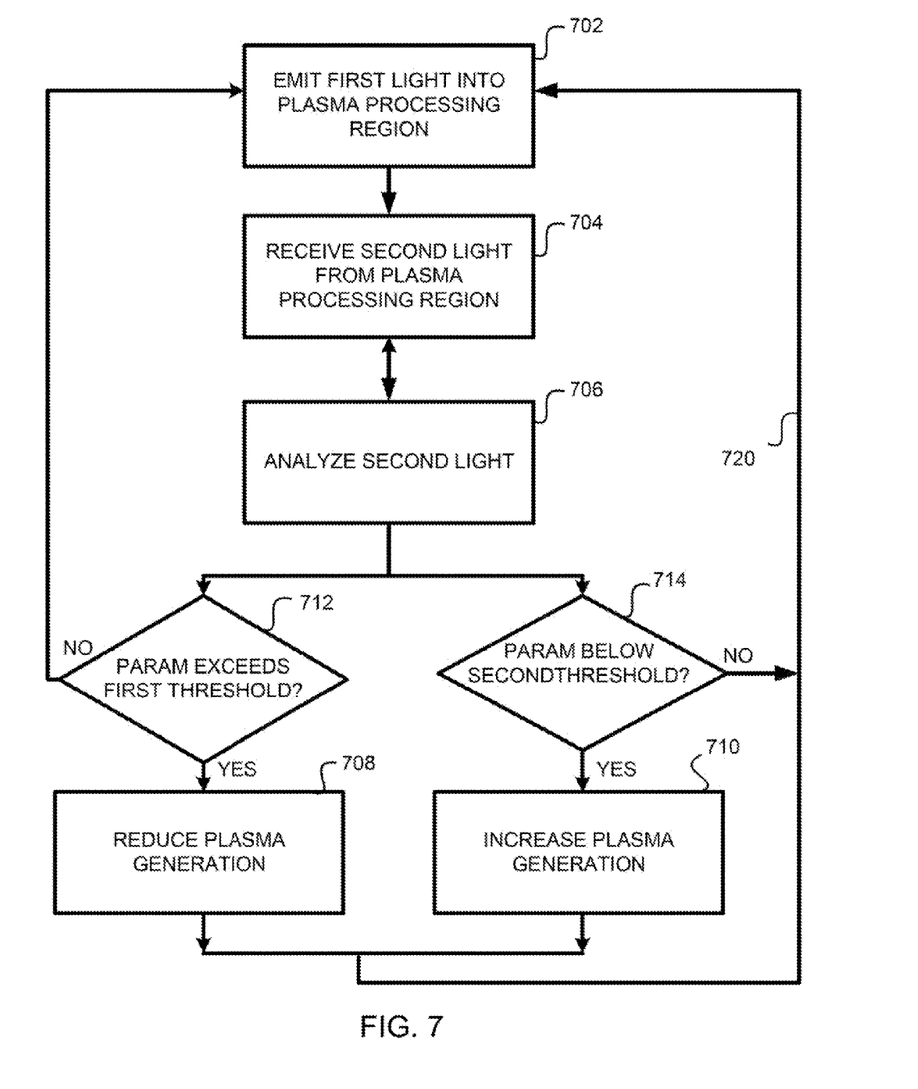
FIG. 7 shows, in accordance with an embodiment of the invention, a method for reducing the effective residence time of the gas to improve uniformity.

FIG. 7 shows, in accordance with an embodiment of the invention, a method for reducing the effective residence time of the gas to improve uniformity. The method is practiced in a plasma system having at least one plasma processing chamber. The chamber includes at least a lower electrode for supporting a substrate and a chamber ceiling disposed above the lower electrode such that a plasma processing region exists between an upper surface of the substrate and the chamber ceiling during processing.

The plasma processing chamber also includes a plasma generation power source for providing energy to generate a plasma in the plasma processing region from supplied reactant gas. In step 702, there is provided a light emitting apparatus for emitting first light into said plasma processing region. In step 704, there is provided a light receiving apparatus for receiving second light, the second light representing an altered version of said first light after the first light passes through said plasma processing region. In step 706, there is provided logic for analyzing the second light to ascertain whether a parameter of the second light exceeds a first threshold or fall below a second threshold. If the parameter of the second light equals or exceeds the first threshold (712), step 708 involves reducing an amount of plasma generation energy provided by said plasma generation power source. If not (step 712), the process returns to step 702 to continue monitoring the emitted light.

If the parameter of the second light equals or falls below the second threshold (714), step 710 involves increasing said amount of plasma generation energy provided by said plasma generation power source. If not (step 714), the process returns to step 702 to continue monitoring the emitted light. The steps of FIG. 7 may be executed iteratively (arrow 720) until substrate processing is completed.

As can be appreciated from the foregoing, embodiments of the invention improve uniformity by effectively reducing the gas residence time. If the RF sources are modulated to enter and exit the reduced mode, the modulation between the reduced mode and the full processing mode may be in the millisecond range which tends to be too long to significantly affect the electron temperature. However, the effective gas residence time is reduced in ways that has not been possible before due to limitations in reducing chamber pressure, chamber volume or limitations in increasing the pumping rate. With reduced effective gas residence time, uniformity is advantageously improved.

Although the examples herein have been discussed in the context of reducing non-uniformity due to by product concentration differential between the edge region of the substrate and the center region of the substrate, embodiments of the invention may be adapted to monitor reaction by-product concentration or pre-cursor concentration and to modulate the RF power to modulate between the normal and reduced modes in order to reduce their effective residence time.

For example, polymer pre-cursor concentration may be monitored in order to control parameters of the normal and reduced modes (such as the duration or RE power level) in order to influence the amount of polymer deposition. As is known, some etch processes may involve a balance between deposition and etching mechanisms/substeps in order to achieve the desired etch result. In these etch applications, it is desirable to control the polymer deposition since, for example, too much or too little polymer deposition may cause undesirable results such as reduced etch rates, non uniformity, defective etch profiles, etc. Embodiments of the invention discussed above may be adapted to, alternatively or additionally, monitor the pre-cursor concentration and modulate duration and/or RE power levels of the normal operating time and the reduced mode time in order to provide an additional control knob for controlling an etch.

Furthermore, the ability to control polymer pre-cursor or by-product concentration on the fly responsive to sensor measurement while etching a substrate may also address the aforementioned aspect ratio dependent etching (ARDE) issue. For example, by giving the etch by-products more time to diffuse out of higher aspect ratio features during reduced mode operation periods or pulses, the concentration of the etch by-products in these high aspect ratio holes and trenches may be better controlled, thereby alleviating ARDE.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system having at least one plasma processing chamber for processing a substrate, comprising: a lower electrode for supporting said substrate; a chamber ceiling disposed above said lower electrode such that a plasma processing region exists between an upper surface of said substrate and said chamber ceiling during said processing; a plasma generation power source for providing energy to generate a plasma in said plasma processing region from supplied reactant gas; a light emitting apparatus for emitting a first light into said plasma processing region; a light receiving apparatus for receiving a second light, said second light representing an altered version of said first light after said first light passes through said plasma processing region; and a controller configured to analyze said second light to ascertain whether a parameter of said second light equals or exceeds a first threshold indicative of a first concentration of by-product gases resulting from a reaction of the plasma with an exposed surface of the substrate or equals or falls below a second threshold indicative of a second concentration of the by-product gases, wherein said controller controls an effective gas residence time of by-product gases on the upper surface of the substrate by adjusting the plasma generation energy level between a full mode of plasma generation and a reduced mode of plasma generation by sending a first signal for reducing an amount of plasma generation energy to a plasma generation energy level associated with the reduced mode of plasma generation provided by said plasma generation power source if said parameter of said second light equals or exceeds said first threshold, said controller sends a second signal for increasing said amount of plasma generation energy provided by said plasma generation power source to a plasma generation energy level associated with the full mode of plasma generation if said parameter of said second light equals or falls below said second threshold, wherein the plasma generation energy level associated with the reduced mode of plasma generation is sufficiently low as to minimize or stop the reaction of the plasma with exposed surfaces of the substrate such that the concentration of by-product gases reduces over time in the reduced mode of plasma generation, and wherein the plasma generation energy level associated with the full mode of plasma generation is sufficiently high as to increase the reaction of the plasma with exposed surfaces of the substrate to a full level in which the concentration of by-product gases increases over time in the full mode of plasma generation.

2. The plasma processing system of claim 1 wherein the plasma processing chamber is a narrow-tap chamber in which a gap between an upper surface of said lower electrode and said chamber ceiling is less than 10% of a diameter of said substrate and the effective residence time of the by-product gases is reduced by selecting the first threshold and the second threshold to reduce the effective residence time of the by-product gases compared with continuous operation in the full mode of plasma generation.

3. The plasma processing system of claim 1 wherein said light emitting apparatus is configured to emit a broad spectrum light.

4. The plasma processing system of claim 1 wherein said light emitting apparatus is configured to emit a laser light.

5. The plasma processing system of claim 1 wherein said chamber ceiling represents a dielectric window.

6. The plasma processing system of claim 1 wherein said light emitting apparatus is a light source with a collimator.

7. The plasma processing system of claim 1 wherein said light receiving apparatus is an optical emission spectroscopy meter.

8. The plasma processing system of claim 1 wherein the controller limits a total time in which the plasma generation power source is continuously in the full mode so as to reduce an effective residence time of a plasma byproduct constituent to be shorter than a steady state residence time which is an amount of time it would take a plasma constituent to physically travel from above the substrate to a region outside the substrate (the normal gas residence time), wherein the effective residence time is calculated by multiplying the normal gas residence time by a fraction of time in which the plasma generation power source is in the full mode.

9. The plasma processing system of claim 8, wherein the effective residence time is no more than about 25% of the normal gas residence time.

10. The plasma processing system of claim 1, wherein the plasma generation energy level associated with the reduced mode of plasma generation is sufficiently low as to minimize the reaction of the plasma with exposed surfaces of the substrate, while ensuring that the plasma is not completely extinguished.

11. The plasma processing system of claim 1, wherein the chamber is configured to maintain a constant flow of the supplied reactant gas between the reduced mode and the full mode.

12. A plasma processing system having at least one plasma processing chamber for processing a substrate, comprising: a lower electrode for supporting said substrate; a plasma generation power source for providing energy to generate a plasma from supplied reactant gas, said plasma is generated in a plasma processing region above said substrate; a light emitting apparatus configured to emit a first light into said plasma processing region; a light receiving apparatus configured to receive a second light, said second light representing an altered version of said first light after said first light passes through said plasma processing region, wherein said second light results after a by-product gas absorbs some portion of wavelength of the first light; and a controller configured to analyze said second light and in response regulate a plasma generation energy level, the controller ascertaining whether a parameter of said second light equals or exceeds a first threshold indicative of a first concentration of the by-product gas, resulting from a reaction of the plasma with an exposed surface of the substrate, or equals or falls below a second threshold indicative of a second concentration of the by-product gas, wherein said controller sends a first signal to reduce an amount of plasma generation energy to a plasma generation energy level associated with a reduced mode of plasma generation provided by said plasma generation power source if said parameter equals or exceeds said first threshold, and wherein said controller sends a second signal for increasing said amount of plasma generation energy to a plasma generation energy level associated with a full mode of plasma provided by said plasma generation power source if said parameter equals or falls below said second threshold, wherein the plasma generation energy level associated with the reduced mode of plasma generation is sufficiently low as to minimize or stop the reaction of the plasma with exposed surfaces of the substrate, and wherein the plasma generation energy level associated with the full mode of plasma generation is sufficiently high as to increase the reaction of the plasma with exposed surfaces of the substrates to a full level, and wherein the plasma generation energy levels associated with the reduced mode and the full mode are sufficiently low and high, respectively, as to ensure that in the full mode, the concentration of by-product gas increases over time, and that in the reduced mode, a concentration of by-product gas is decreased over time with respect to a concentration of by-product gas provided by the full mode.

13. The plasma processing system of claim 12, wherein the plasma generation energy level associated with the reduced mode of plasma generation is sufficiently low as to minimize the reaction of the plasma with exposed surfaces of the substrate, while ensuring that the plasma is not completely extinguished.

14. The plasma processing system of claim 12, wherein the chamber is configured to maintain a constant flow of the supplied reactant gas between the reduced mode and the full mode.

15. A plasma processing system having at least one plasma processing chamber for etching a substrate, comprising: a lower electrode for supporting said substrate;
a chamber ceiling disposed above said lower electrode such that a plasma processing region exists between an upper surface of said substrate and said chamber ceiling during a processing;
a plasma generation power source for providing energy to generate a plasma in said plasma processing region from supplied reactant gas; a light emitting apparatus for emitting a first light into said plasma processing region; a light receiving apparatus for receiving a second light, said second light representing an altered version of said first light after said first light passes through said plasma processing region; and a controller configured to determine a plasma generation level during etching of the substrate to control an effective residence time of a byproduct gas on the upper surface of said substrate by comparing a parameter of the second light indicative of a concentration of the by-product gas, resulting from a reaction of the plasma with the exposed upper surface of the substrate, with an upper and a lower threshold indicative of a concentration of the byproduct gas, and based on the comparison, make a decision between increasing a plasma generation power based on the lower threshold to a full mode of plasma generation in which the concentration of the byproduct gas increases over time and reducing the plasma generation power based on the upper threshold to a reduced mode of plasma generation in which the concentration of the byproduct gas decreases over time.

16. The plasma processing system of claim 15, wherein the plasma generation level is selected based on comparing at least one of the upper and lower thresholds associated with the parameter of said second light and in response adjust the plasma generation level to control the effective residence time of the byproduct gas.

17. The plasma processing system of claim 16, wherein 1) the reduced mode of plasma generation is selected if said parameter of said second light equals or exceeds the upper threshold indicative of a first concentration of the by-product gas resulting from the reaction of the plasma with the exposed upper surface of the substrate; and 2) the full mode of plasma generation is selected if said parameter of said second light equals or falls below the lower threshold.

18. The plasma processing system of claim 17, wherein the effective residence time is no more than about 25% of a normal gas residence time when only the full mode is used.

19. The plasma processing system of claim 15 wherein the plasma processing chamber is a narrow-gap chamber in which a gap between an upper surface of said lower electrode and said chamber ceiling is less than 10% of a diameter of said substrate.

* * * * *